(12) United States Patent
Hancock et al.

(10) Patent No.: US 7,072,779 B2
(45) Date of Patent: Jul. 4, 2006

(54) POWER MANAGEMENT INTEGRATED CIRCUIT

(75) Inventors: Martin A. Hancock, Victoria (CA); J. Bradford Forth, Victoria (CA); Simon H. Lightbody, Victoria (CA); Benedikt T. Huber, Victoria (CA); Michael E. Teachman, Victoria (CA)

(73) Assignee: Power Measurement Ltd., Saanichton (CA)

( * ) Notice: Subject to any disclaimer, the term of this patent is extended or adjusted under 35 U.S.C. 154(b) by 0 days.

(21) Appl. No.: 11/252,259

(22) Filed: Oct. 17, 2005

(65) Prior Publication Data

US 2006/0052958 A1   Mar. 9, 2006

Related U.S. Application Data

(63) Continuation of application No. 10/734,387, filed on Dec. 12, 2003.

(60) Provisional application No. 60/436,187, filed on Dec. 23, 2002, provisional application No. 60/488,700, filed on Jul. 15, 2003.

(51) Int. Cl.
*G06F 19/00* (2006.01)

(52) U.S. Cl. .................................... 702/60

(58) Field of Classification Search .................. 702/60
See application file for complete search history.

(56) References Cited

U.S. PATENT DOCUMENTS

| | | | |
|---|---|---|---|
| 4,423,459 A | 12/1983 | Stich et al. | 361/94 |
| 4,967,145 A | 10/1990 | Davies | 324/127 |
| 5,270,898 A | 12/1993 | Elms et al. | 361/93 |
| 5,289,191 A | 2/1994 | Elms | 341/127 |
| 5,461,634 A | 10/1995 | McGrath et al. | 371/67.1 |
| 5,524,083 A | 6/1996 | Horne et al. | 364/492 |
| 5,525,985 A | 6/1996 | Schlotterer et al. | 341/136 |
| 5,544,089 A | 8/1996 | Hemminger et al. | 364/492 |
| 5,706,214 A | 1/1998 | Putt et al. | 364/571 |

(Continued)

FOREIGN PATENT DOCUMENTS

EP      0 335 511 A1   10/1989

(Continued)

OTHER PUBLICATIONS

"Single Phase Bi-Directonal Power/Energy IC," *Cirrus Logic*, Austin, Texas, Jul. 26, 2000.

(Continued)

*Primary Examiner*—Michael Nghiem
*Assistant Examiner*—C. Khuu
(74) *Attorney, Agent, or Firm*—Brinks Hofer Gilson & Lione

(57) ABSTRACT

A power management integrated circuit for monitoring a parameter of a power system includes sensor interface circuitry, first logic, at least one random access memory, second logic, and a communication interface. The sensor interface circuitry is operative to receive and process signals representative of voltage and current in a power system. The first logic is operative to receive the signals and produce at least one power parameter. The random access memory is operative to store the at least one power parameter. The second logic is operative to process at least one incoming communication packet and generate at least one outgoing communication packet encapsulating the power parameter. The communication interface is operative to process the at least one incoming communication packet and transmit the at least one outgoing communication packet. The power management integrated circuit may also include a geographic positioning system receiver and a real time clock.

51 Claims, 4 Drawing Sheets

U.S. PATENT DOCUMENTS

| | | | |
|---|---|---|---|
| 5,793,595 A | 8/1998 | Schweitzer, III et al. | 361/97 |
| 5,793,750 A | 8/1998 | Schweitzer, III et al. | 370/242 |
| 5,862,069 A | 1/1999 | Nestler | 364/754.01 |
| 5,995,911 A * | 11/1999 | Hart | 702/64 |
| 6,278,392 B1 | 8/2001 | Nestler | 341/143 |
| 6,292,717 B1 * | 9/2001 | Alexander et al. | 700/293 |
| 6,417,792 B1 | 7/2002 | King et al. | 341/143 |
| 6,429,637 B1 | 8/2002 | Gandhi | 324/74 |
| 6,504,357 B1 * | 1/2003 | Hemminger et al. | 324/142 |
| 2002/0104031 A1 | 8/2002 | Tomlinson et al. | 713/320 |
| 2002/0141231 A1 | 10/2002 | Komori | 365/158 |
| 2002/0141438 A1 | 10/2002 | Smith et al. | 370/465 |

FOREIGN PATENT DOCUMENTS

| | | |
|---|---|---|
| EP | 0 860 946 A2 | 8/1998 |
| EP | 0 949 733 A2 | 10/1999 |
| EP | 0 949 734 A2 | 10/1999 |
| EP | 1 098 412 A2 | 5/2001 |

OTHER PUBLICATIONS

"Three New Chips From Cirrus Logic Provide Energy Management for Home Appliances and Industrial Machinery," *CIRRUS Press Release*, Austin, Texas, Nov. 9, 2000.

"MicroConverter, Dual-Channel 16-Bit ADCs with Embedded Flash MCU," *Analog Devices, Inc.*, Norwood, MA, Feb. 14, 2001.

ADE7756 "Active Energy Metering IC with Serial Interface", *Analog Devices, Inc.*, Norwood, MA, May 4, 2001.

J-F Mironneau and Bill Dickerson, "ITMEL: Instrument Transducer-Meter communication Ethernet Link," *ITMEL Revision 05*, Sep. 13, 2002.

ADE7751 "Energy Metering IC with On-Chip Fault Detection," *Analog Devices, Inc.*, Norwood, Ma, May 7, 2002.

ADE7754 "Poly-phase Multi-Function Energy Metering IC with serial Port," *Analog Devices, Inc.*, Norwood, MA, Aug. 27, 2002.

ADE7755 "Energy Metering IC with Pulse Output," *Analog Devices, Inc.*, Norwood, MA, May 16, 2002.

CS54604A "Single-Phase Bi-Directional Power/Energy IC," *Cirrus Logic, Inc.*, Austin, TX 01/2003.

"PSoC Energy Meter Demonstration Kit," *Cypress MicroSystems, Inc.*, Lynnwood, WA, Sep. 26, 2003.

"Electric Power Meter Architecture and Design," *Cypress MicroSystems, Inc.*, Lynnwood, WA., Sep. 26, 2003.

* cited by examiner

POWER MANAGEMENT INTEGRATED CIRCUIT

RELATED APPLICATIONS

This application is a continuation of U.S. patent application Ser. No. 10/734,387, "Integrated Circuit With Power Monitoring/Control and Device Incorporating Same" filed Dec. 12, 2003, which claims the benefit under 35 U.S.C. §119(e) of U.S. Provisional Application Ser. No. 60/436,187, "Integrated Circuit with Power Monitoring/Control and Fieldbus Communication and Device Incorporating Same", filed Dec. 23, 2002, both of which are incorporated by reference herein. U.S. Provisional Application Ser. No. 60/488,700, "Wireless Communication Network and RF Devices for Non-intrusive Energy Monitoring and Control", filed Jul. 15, 2003, is also incorporated by reference herein.

The following co-pending and commonly assigned PCT/U.S. Patent Application has been filed on the same date as the present application. This application relates to and further describes other aspects of the embodiments disclosed in the present application and is herein incorporated by reference:

U.S. Pat. Application Ser. No. PCT/US03/39702, "Integrated Circuit with Power Monitoring/Communications and Device Incorporating Same".

BACKGROUND

The invention relates generally to the field of digital power monitoring and control. More specifically the invention relates to a power monitoring and control apparatus incorporating an application specific integrated circuit.

The field of digital power monitoring and control includes such devices as energy/power meters, protective relays, Programmable Logic Controllers ("PLC's"), Remote Terminal Units ("RTUs"), fault recorders, power quality monitors, etc. Generally these devices are referred to as Intelligent Electronic Devices ("IEDs"). Due to the continuing pressure to reduce the cost of electrical installations, the different types of IEDs continue to incorporate and integrate the features of one another. For instance, it is common to find digital power meters incorporating features of fault recorders and power quality monitors. In addition protective relays are incorporating more and more power meter functionality.

A typical digital power meter is described in U.S. Pat. No. 6,185,508 to Van Doom et al. entitled "Power Meter for Determining Parameters of Multiphase Power Lines." This power meter contains a number of circuit elements including a processor, memory, analog and digital interface circuitry, communications circuitry, display circuitry, etc. The device is highly programmable as it contains both non-volatile RAM and flash memory allowing both the user and the manufacturer the ability to configure the device to perform different functions.

A typical protective relay is described in U.S. Pat. No. 5,793,595 to Schweitzer et al. entitled "Multi-Application Relay for Power Systems." This device includes similar circuitry as a digital power meter although the software and application are different.

Application Specific Integrated Circuits ("ASICs") capable of calculating power parameters such as rms voltage, rms current and power are available. Such ASICS may also be capable of generating energy signals representative of the calculated energy parameters. Typical devices are described in U.S. Pat. No. 5,862,069 to Nestler ("Four Quadrant Multiplying Apparatus and Method"), U.S. Pat. No. 6,278,392 to Nestler ("Gain Adjustable Sigma Delta Modulator System") and U.S. Pat. No. 6,417,792 to King et al. ("Single Phase Bi-Directional Electrical Measurement Systems and Methods Using ADCs"). These devices are typically inflexible as to the functions they perform and are often not practical for use in advanced programmable IEDs.

DETAILED DESCRIPTION OF THE PRESENTLY PREFERRED EMBODIMENTS

Herein, the phrase "coupled with" is defined to mean directly connected to or indirectly connected through one or more intermediate components. Such intermediate components may include both hardware and software based components. Herein, the term "Application Specific Integrated Circuit" or "ASIC" refers to an integrated circuit designed for a particular use in the broadest sense including integrated circuits designed from the ground up for a particular purpose and integrated circuits that are manufactured to at least some extent generically and later customized.

Figure 1:
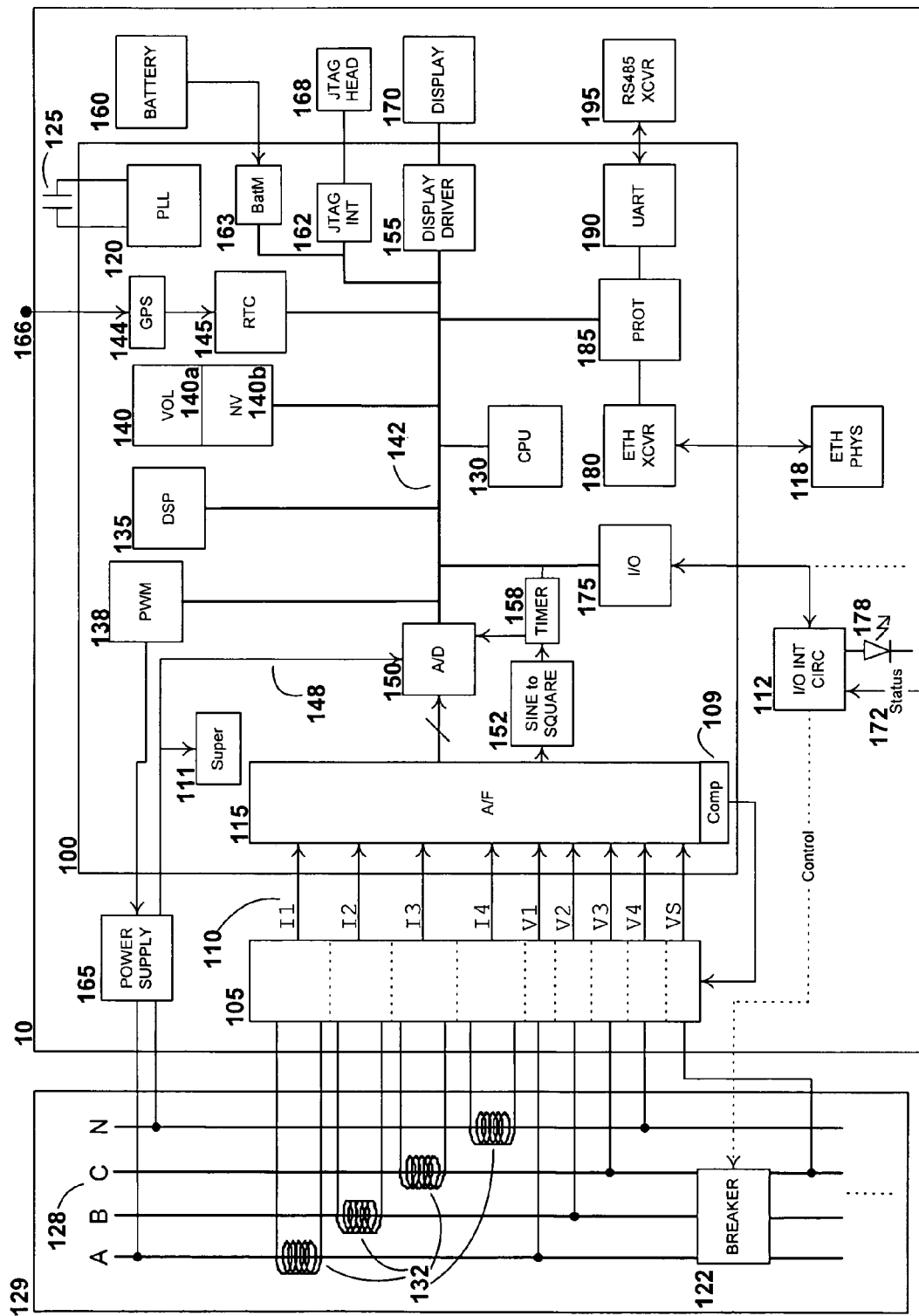
FIG. 1 depicts a block diagram of an IED incorporating an ASIC.

FIG. 1, illustrates an example power monitoring and control IED 10 that is capable of implementing functionality from digital power meters, protective relays, power quality monitoring devices, fault recorders, PLCs and RTUs. Also illustrated in FIG. 1 is an example power monitoring and control ASIC 100 that is a building block of the IED 10.

The ASIC 100 is a single integrated circuit that may include the majority of the circuitry used to implement the functionality of IED 10. Accordingly, with the ASIC 100 it may only be necessary to supply power to the IED 10, provide typical support circuitry within the IED 10 and provide interfaces from the IED 10 to the outside world in order to implement a complete power monitoring and control device. The ASIC 100 may be formed on an applicable silicon, plastic or other semiconductor substrate.

As illustrated in FIG. 1, a power system 129 that includes power lines 128, such as the illustrated three phase power lines, are interfaced through interface circuitry 105 included in the IED 10. The interface circuitry 105 may include filtering, transformation, phase shifting or any other current and voltage related conditioning. The power lines 128 are shown as a 4 Wire Wye system, although the IED 10 is equally applicable to other wiring arrangements such as 3 Wire Delta, Single Phase, etc. Current Transformers ("CTs") 132 are used to monitor the current flowing in the power lines. The CTs 132 reduce the signal level to a point compatible with interface circuitry 105. It will be noted that other types of current sensors such as Hall effect sensors, Rogowski coils, etc. may be used. The CTs 132 are external transformers that are external to the IED 10. The interface circuitry 105 may also scale the voltage signals coming from the power lines to a voltage level that is compatible with the ASIC 100 using, for example, transformers, resistors, and/or capacitors, etc. as appropriate. Typically, the power lines may carry signals from 100V AC/100 A and up. The interface circuitry 105 may scale these voltages and currents to some magnitude, such as 5V or less, that is compatible with the ASIC 100. The signals (I1, I2, I3, I4, V1, V2, V3, V4, VS) 110 enter an analog front end 115 included within the ASIC 100. The signals are then available for use within the ASIC 100 and the IED 10 for monitoring, calculations, control, etc as described later. In an alternative example additional or fewer channels can be used.

The analog front end 115 may provide additional scaling and filtering before the signals 110 are fed to an analog to digital converter (A/D) 150. The analog front end 115 may also incorporate programmable gain amplifiers on each channel which are configurable by a central processing unit (CPU) 130 included in the ASIC 100. The CPU 130 may be any form of processor or logic capable of executing instructions, logic tasks and/or operating code to manage overall functionality, perform calculations, control inputs/outputs, etc. within the ASIC 100. The A/D 150 may be of sigma delta, successive approximation or any other applicable technology. Also, the A/D 150 may be composed of a single conversion block with a multiplexed front end or may be composed of multiple conversion blocks. It will be noted that multiple conversion blocks allow the simultaneous conversion of multiple signals, which may mean that less compensation for non-simultaneous sampling is required later during the calculation of various power parameters.

Interface circuit 105 may contain active current transformers that scale the larger currents provided by CTs 132 to smaller currents. In this case, analog front end 115 may contain compensation circuitry 109 to drive the active current transformers.

The A/D 150 may interface to a bus 142. The bus 142 may be any form of a communication pathway, such as a metallization, for data and other signals within the ASIC 100. Communication over the bus 142 allows a digital signal processor (DSP) 135 and/or the CPU 130 to access the conversion values inside the A/D 150. The DSP 135 may be any form of digital processor or logic that executes instructions, logic task and/or operating code to perform calculations and/or any other tasks related to analog information that has been converted to digital form within the ASIC 100. In the illustrated example, the ASIC 100 includes both the DSP 135 and CPU 130. Alternatively, the ASIC 100 may include only the CPU 130 or the DSP 135. In general, the CPU 130 and DSP 135 can be referred to as processor cores that enable the functionality of the ASIC 100. The presence of the DSP 135 may allow the ASIC 100 to perform more complicated calculations, increase functionality, enhance performance, etc. The absence of the DSP 135, on the other hand, may allow for a reduction in silicon area and therefore a reduction in cost of the ASIC 100. In other examples, additional buses may be used to further increase performance or decrease latency between the various components in the ASIC 100. Dedicated buses can also make it easier to add and remove parts of the ASIC 100 further increasing the design configurability.

Additional components may also be included in the ASIC 100 and interfaced to the bus 142 such as a pulse width modulator ("PWM") 138, a memory 140, a real time clock ("RTC") 145, a display driver 155, sine to square wave conversion circuitry 152, a timer 158, a protocol engine 185, input/output ("I/O") interface circuitry 175, an Ethernet transceiver 180 and a universal asynchronous receiver transmitter (UART) 190 that are described later.

Power Supply Operation

Power supply circuitry 165 may also be included in the IED 10. The power supply circuitry 165 may interface to at least one phase of the power system 129 and provide operating voltage(s) such as DC voltage to the IED 10. Alternatively, power supply circuitry 165 may be external to the IED 10 and/or powered from any other power source. Switching power supplies often incorporate a pulse width modulation or similar controller, to maintain the output voltage substantially constant with varying load. The pulse width modulation controller maintains the voltage substantially constant by monitoring the output voltage and adjusting the on-time of a switch(es) within the power supply.

In the illustrated IED 10, the output voltage of the power supply circuitry 165 may be monitored by the ASIC 100 using the A/D 150 and a power monitor line 148. Instead of a separate pulse width modulated controller, the CPU 130 may direct the generation of a pulse width modulated signal with a control circuit, such as the PWM 138. The pulse width modulated signal generated by the PWM 138 may control the output voltage of the power supply circuitry 165 via the bus 142. This results in a cost savings since a pulse width modulation controller is not required within the power supply circuitry 165. In addition, since the A/D 150 also interfaces to the input voltage from the power system 129, more complex power supply control algorithms are possible. For instance, if the CPU 130 detects (through the A/D 150) that the power system 129 voltage on phase A is below the threshold required to maintain full operation of the IED 10, the CPU 130 may execute instructions to preemptively begin disabling portions of the IED 10 in order to reduce the load on the power supply circuitry 165.

During initial power on of the IED 10, the CPU 130 may not be able to control the output of the power supply circuitry 165 until the CPU 130 begins executing operating code. Therefore, appropriate "bootstrap" circuitry may be provided in the power supply circuitry 165 in order to provide a starting voltage for the CPU 130. Alternatively, the CPU 130 may be provided an alternative power supply, such as a battery 160. The alternative power supply may be utilized during initial power up, as well as when no power is available from the power supply circuitry 165.

The ASIC 100 may also contain battery monitoring circuitry 163. The battery monitoring circuitry may send a signal to the CPU 130 and/or DSP 135 indicative of the charge in the battery 160.

The ASIC 100 may also contain a supervisory circuit 111. The supervisory circuit 111 may detect when the output of the power supply 165 falls below a first threshold voltage. The supervisory circuit 111 may then initiate an interrupt to the CPU 130 and/or DSP 135. The supervisory circuit 111 may also, or as an alternative, reset the ASIC 100 circuitry when the output of the power supply 165 falls below a second threshold voltage.

Display

The CPU 130 and/or the DSP 135 may send information over the bus 142 to the display driver 155. In addition, the CPU 130 and/or the DSP 135 may receive user input over the bus 142 from the display driver 155. The display driver 155 may provide both display driving and user input scanning functions. A display module 170 included within the IED 10 may be driven by the display driver 155. The display module 170 may include, for example, a quarter VGA monochrome LCD display. Other display resolutions, technologies such as plasma, vacuum fluorescent, light emitting plastic ("LEP"), touchscreen, etc. as well as color displays may similarly be driven with the ASIC 100. The display module 170 can display purely graphical or text based displays and mixtures of both graphics and text. The display module 170 may also include circuitry to receive input from a user such as input buttons, touchscreen circuitry, dials, joysticks, etc.

Clock Generation

The ASIC 100 may also include a phase lock loop ("PLL") circuit 120. The PLL circuit 120 may interface to a crystal 125 that is included in the IED 10 external to the ASIC 100. The crystal 125 may be a 32.768 kHz tuning fork type, although other frequencies and structures are possible. Alternatively, any other timing mechanism may be included in the IED 10. The PLL circuit 120 may provide various frequency clock signals to the subsystems within the ASIC 100. For example, a 1 kHz clock signal may be transmitted over the bus 142 from the PLL circuit 120 to the RTC 145. Similarly, clock signals such as 33 MHz and 40 MHz clock signals may be sent to the CPU 130 and the DSP 135, respectively, over the bus 142. In addition, a clock signal such as a 25 MHz clock signal may be provided to the Ethernet transceiver 180. Further a clock signal such as a 4.9152 MHz clock signal may be sent to the UART 190, and the timer 158 may receive a clock signal such as a 50 MHz clock signal.

The CPU 130 may also direct the PLL circuit 120 to change any of these clock signal rates dynamically in order to implement reduced power modes, etc. In addition the particular clock rates are somewhat arbitrary and subject to modification in a particular implementation. Due to the fact that all clock signals (except the relatively low frequency 32.768 kHz signal from the crystal 125) are inside the ASIC 100, electromagnetic emissions and susceptibility may be less of a concern than with designs with clock signals distributed to various circuit elements over a printed circuit board. In addition, in alternate high speed implementations the clock signals can operate at frequencies higher than may not be practical to transmit over a printed circuit board trace due to the length, impedance, etc. of such traces.

Memory

The memory 140 included within the ASIC 100 may be split into two sections. A first section of the memory 140 may be volatile RAM memory 140a. A second section of the memory 140 may be non-volatile flash memory 140b. The volatile memory 140a may store operating data such as CPU 130 or DSP 135 stacks, variables, intermediate calculated values, digital samples indicative of the waveform of the voltage, current, or power being monitored, etc. that are lost when power is removed from the device. The non-volatile memory 140b may include operating code in the form of instructions for the DSP 135 and the CPU 130. In addition, the non-volatile memory 140b may include data logs, waveform logs, energy values, configuration information, etc. that are preferably not lost during power interruption to the IED 10. The non-volatile memory 140b may also be further divided into a flash memory segment and a battery backed RAM segment since writing to RAM is much faster than writing to flash. In an alternative example instead of a battery backed RAM segment, a SuperCap or other large capacity capacitor could be used to provide energy to the RAM segment. It is further contemplated that a magnetic RAM ("MRAM") may be integrated into the ASIC 100, the memory 140 may be composed of MRAM and thus provide non-volatility and relatively fast writing capability without the need of a backup power source. Alternatively, any combination of one or more of the previously discussed types of memory may be utilized for the memory 140. In addition, any other types of random access memory that are available for the ASIC 100 may also be used. For a discussion of other types of memory, see the discussion of "High Density Random Access Memory in an Intelligent Electric Device", in U.S. Provisional Application Ser. No. 60/436, 187, "Integrated Circuit with Power Monitoring/Control and Fieldbus Communications and Device Incorporating Same" incorporated herein by reference.

In still another alternative, the ASIC 100 may access distributed memory resources available on an intranet or the Internet through the Ethernet transceiver 180.

Sample Rate Generation

In order to get the highest accuracy in rms calculations (such as RMS voltage and current calculations) the A/D 150 may sample an integral number of times per line frequency cycle. To minimize the amount of processing power used for calculating fast Fourier transforms ("FFTs") the integral number may be a determined value such as, a power of two. Therefore, it may be desirable to sample at a sample rate of, for example, 256 samples per line frequency cycle. Other sample rates such as 32, 64, 128, 512, 1024 and up to the MHz range for power quality applications may also be used. The FET is a specific type of Discrete Fourier Transform ("DFT"). Other examples of DFTs include Wavelet Transform, Discrete Cosine Transform and eigenvalues of the eigenvectors of the autocorrelation matrix which may also be usable.

During operation, for the CPU 130 or DSP 135 to obtain samples representative of the voltage and current in the power system 129 the sine to square wave conversion circuitry 152 may process a signal from the analog front end 115, such as a scaled version of one of the voltages in the power system 129. The resulting square wave may be fed to the timer 158 or alternatively to the DSP 135/CPU 130. The timer 158 may be operated in a mode to produce a timing signal at a frequency that corresponds to the sample rate of the A/D 150. This timing signal may be fed directly from the timer 158 to the A/D 150, or alternatively to the DSP 135/CPU 130. For example, the timer may produce a timing signal with 256 times the frequency of the square wave when the sample rate of the A/D 150 is desired to be 256 times the power system 129 frequency. Alternatively, with a sigma delta A/D 150, the timer 158 may be operated in a mode to produce a timing signal that is approximately 1000 times the frequency of the desired output word rate from the A/D 150. In yet another alternative, when using a sigma delta A/D 150 the timer 158 may operate in a mode to produce a fixed frequency timing signal to drive the A/D 150. The fixed frequency timing signal may be independent of the frequency of the power system 129. The mode and resulting multiplication factor of the timer 158 may be programmable over the bus 142.

JTAG Interface

The ASIC 100 may also include a joint test action group (JTAG) interface 162. The JTAG interface 162 may be coupled with a JTAG header 168 in the IED 10 that is external to the ASIC 100. Programming of the non-volatile section of the memory 140 may be performed with the JTAG interface 162 during manufacture of the IED 10. In addition, the JTAG interface 162 may be utilized for testing of both the internal circuitry and external interfaces of the ASIC 100.

Calculations

During operation, the DSP 135 and/or CPU 130 may receive samples of voltages and currents from the A/D 150. As previously discussed, there may be a determined integral number of samples per line frequency cycle. From these samples, various power parameters such as rms voltage line to neutral, rms voltage line to line, rms current, kW (per phase and total), kVA (per phase and total), kVAR (per phase and total), total harmonic distortion, harmonics per phase, etc may be calculated. Various methods of calculating these parameters may be implemented as instructions stored in the memory 140 and executed by the DSP 135 and/or the CPU 130. Alternatively dedicated logic may be provided to perform some or all of these calculations.

In addition, the DSP 135 may be utilized to perform an FFT/DFT on the voltage and current samples, as well as calculate power parameters entirely in the frequency domain, and on a per harmonic basis. The combination of these capabilities may be especially valuable when hybrid protective relay and power quality functionality is desired in a single IED 10. Many protective relay algorithms react only to the fundamental frequency whereas power quality algorithms may desire power parameters calculated over many harmonics of the fundamental frequency.

Once the power parameters are calculated, they may be stored in the volatile 140*a* or non-volatile 140*b* section of the memory 140 as appropriate. Additionally, the raw data samples and other derived values may be stored in the memory 140 for further processing or consumption by other modules within the ASIC 100.

Using a table of rate/tariff values a cost of the power management quantity being measured can be assigned. The rate/tariff values may define the relationship between the amount of energy used, and the cost of that energy. The cost of the energy may be dependent on the time when the energy was consumed. In one example, the amount of energy used during a particular period of time is calculated. Using the rate/tariff the cost of the energy can be calculated and stored in the memory 140 for further processing or consumption by other modules within the ASIC 100.

As part of the calculation of the parameters, adjustments and compensation for distortions and errors in the original sampled data can be performed. Such distortions and/or errors may be introduced in the analog to digital conversion process, such as in the analog front end 115. Errors and distortions may include changes to the phase of the signal and amplitude. Automatic corrections may be made for errors introduced before the analog signal enters the IED 10, such as those caused by electrical transformers elsewhere in the power system 129. Additionally, calibration of the analog to digital conversion may be performed at multiple points across the input range of the analog signal. These corrections and calibrations may be made by the CPU 130 and/or DSP 135 using compensation algorithms stored in memory 140.

The ASIC 100 may detect transients, sags, swells and other power quality events in the power system 129 as represented in the signals 110. In addition the CPU 130 or DSP 135 may calculate power parameters indicative of power quality such as harmonic levels. For some power quality applications it may be necessary for interface circuitry 105 to have multiple gain stages in order to capture the magnitude of operational signals as well as those experienced during a power quality event.

Protocol Engine

The protocol engine 185 may manage communication of information such as power parameters, setup and configuration with devices external to the ASIC 100. The protocol engine 185 may interface through the bus 142 with the memory 140, the CPU 130 and the DSP 135. Alternatively, the functionality of the protocol engine 185 can be implemented as instructions in firmware residing in the memory 140. As such, the instructions may be executed by CPU 130 to manage communication of information.

The protocol engine 185 may generate and process information in a packet based protocol such as Fieldbus and/or TCP/IP. Fieldbus packets may include open protocols such as Modbus®, Profibus, DNP, IEC 870-5 family of protocols or other proprietary protocols such as the ION® protocol from Power Measurement Ltd. located in Saanichton, B.C., Canada. The protocol engine 185 may receive and transmit packets through the UART 190. The UART 190 may provide an interface to devices external to the IED 10. In the illustrated example, the UART 190 provides an interface via an RS-485 transceiver 195 that is included in the IED 10. In other examples, other communication devices such as an RS232 transceiver, infrared transceiver, etc. may be interfaced with the UART 190 to provide communication external to the IED 10. Examples include interfacing to modems or other communication devices. Alternatively, the transceiver 195 may be integrated into the ASIC 100.

Fieldbus protocols may be designed for transmission of information over some distance (typically between IEDs 10 or between an IED 10 and a computer). These types of communication links may be prone to causing errors in the information transmitted. Therefore, Fieldbus protocols may contain error detection and/or correction provisions such as containing a cyclic redundancy check (CRC) of the information within the packet. Fieldbus protocols may allow for communication between multiple devices. Therefore a unit ID or other means of indicating the source and/or destination for a packet may also be provided. Another type of error detection/correction that may be used is forward error correction (FERC) codes.

The protocol engine 185 may also receive and transmit Fieldbus and/or TCP/IP packets through the Ethernet transceiver 180. The Ethernet transceiver 180 is a communication interface to devices external to the IED 10. In the illustrated example, external communication with the Ethernet transceiver 180 is via an Ethernet Physical Layer transceiver 118 included in the IED 10. Encapsulation and transmission of Fieldbus packets within TCP/IP packets and transmission of TCP/IP packets over RS-485 is also possible with the protocol engine 185 using the Ethernet transceiver 180 and the UART 190, respectively. In addition, the use of wireless, and/or powerline carrier transmitters/receivers is also contemplated. Further, support for many different Internet and Ethernet related protocols and standards such as simple mail transfer protocol ("SMTP"), simple network management protocol ("SNMP"), post office protocol ("POP"), hyper text transfer protocol ("HTTP"), extensible markup language ("XML"), hyper text markup language ("HTML"), simple object access protocol ("SOAP"), bootstrap protocol ("BOOTP"), point to point protocol ("PPP"), dynamic host configuration protocol ("DHCP"), etc. is possible in both hardware and software within the ASIC 100 depending on the application.

Figure 2:
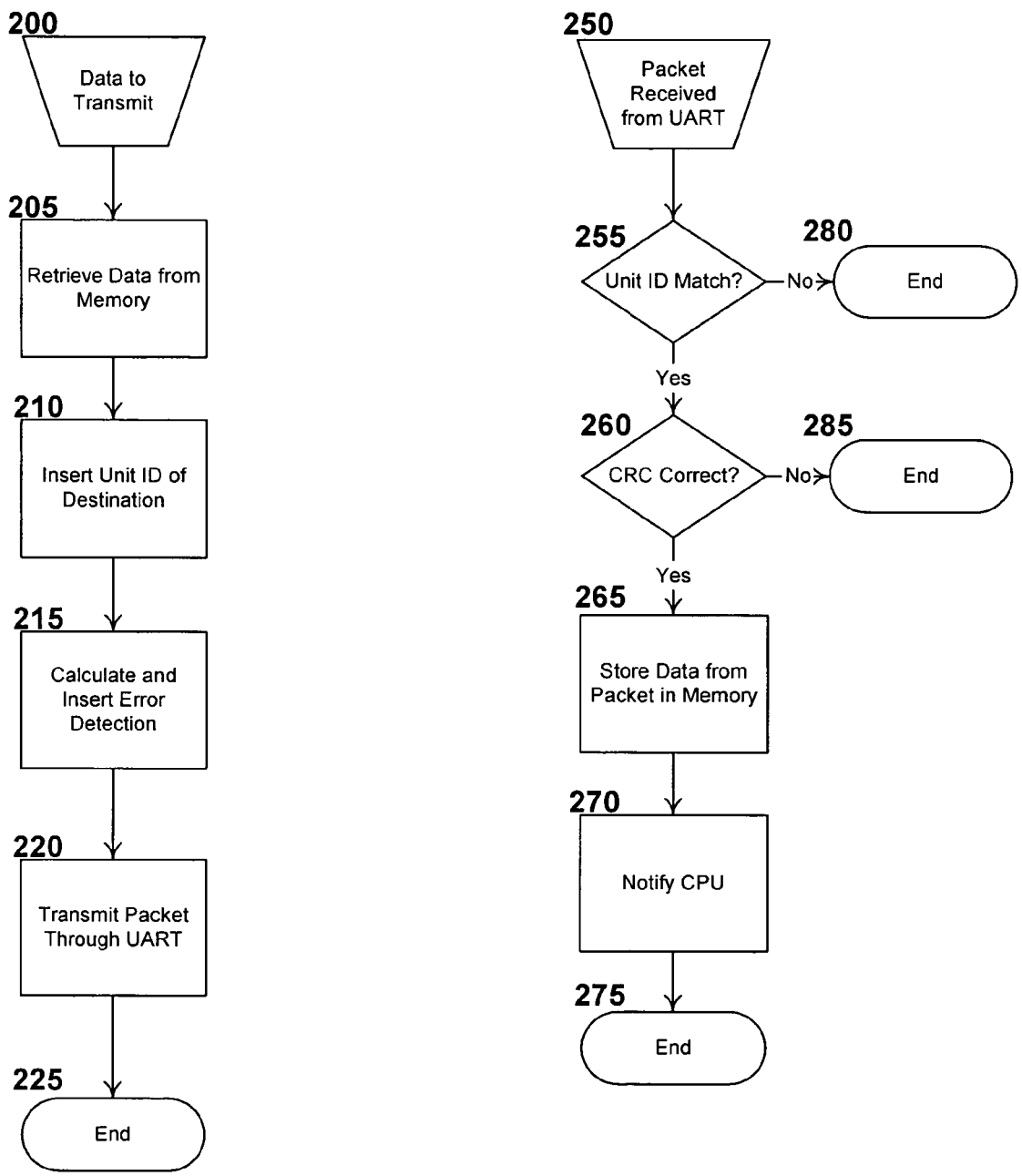
FIG. 2 depicts a flow chart of the operation of a protocol engine of the IED illustrated in FIG. 1.

Referring now to FIG. 2, example operation of the protocol engine 185 utilizing the Fieldbus protocol is shown in block diagram form. When data is available to transmit at block 200, the protocol engine 185 retrieves the data from the memory 140 at block 205. The protocol engine 185 inserts the unit ID of the destination into a Fieldbus packet at block 210. At block 215, the protocol engine 185 calculates and inserts an error detection scheme such as a cyclic redundancy check ("CRC") into the Fieldbus packet. The packet, including the unit ID and CRC (and other data), is then transmitted through the UART 190 at block 220 and the operation completes at block 225.

When a Fieldbus packet is received from the UART 190 by the protocol engine 185 at block 250, the unit ID in the received packet is checked at block 255. If the unit ID is not that of the IED 10, no further processing of the received packet is done and the operation ends at block 280. If the unit ID is that of the IED 10, the CRC or other error detection/correction code within the received packet is checked at block 260. If the CRC is incorrect, no further processing of the received packet is done and the operation ends at block 285. If the CRC within the received packet is correct (and other data as required by the protocol is verified to be correct), the data within the received packet is stored in the memory 140 at block 265. At block 270, the protocol engine 185 notifies the CPU 130 and/or DSP 135 of the presence of new data, and the operation completes at block 275. The CPU 130/DSP 135 may alternatively do further processing of the packet or data contained within the packet.

The protocol engine 185 can also incorporate security functionality to encrypt, decrypt and authenticate the incoming and outgoing Fieldbus packets. The security functionality allows the transfer of information contained within the Fieldbus packets with significantly reduced chance of the information being disclosed or corrupted by third parties or, at the least, being able to detect when a message has been modified. Some advanced examples include using Advanced Encryption Standard ("AES"), Digital Encryption Standard ("DES") and various public key encryption algorithms.

The transmission and reception of data in TCP/IP format by the Ethernet transceiver 180 follows a similar flow to that of the UART 190, although the amount of information in each packet may be greater.

The protocol engine may act as both a master or a slave in the Fieldbus communications network. In addition depending on the protocol, the protocol engine can operate in a peer-to-peer network architecture.

Realtime Clock and Logging

Referring again to FIG. 1, the realtime clock ("RTC") 145 may maintain a time reference for the IED 10 and ASIC 100. The RTC 145 may be driven by a 1 kHz clock as described above, and therefore may provide time accuracy to 1 ms. The RTC 145 may be set in response to packets delivered through the protocol engine 185 or over the JTAG interface 162. The time in the RTC 145 can be retrieved over the bus 142 by either the DSP 135 or the CPU 130.

During operation, the ASIC 100 may be configured such that the CPU 130 (or DSP 135) may direct the recording of power parameters and other information in the non-volatile portion of memory 140. The recording may occur at a periodic rate or in response to setpoints as described below. The recorded information may be time stamped with a value provided by the RTC 145 at the time when the power parameters and/or other information is recorded. These timestamps may also be recorded in the non-volatile portion of the memory 140. This mechanism may provide event and data logs that can be communicated to devices external to the IED 10 through the protocol engine 185. The ASIC 100 may timestamp any power parameter calculated or available to the CPU 130 or DSP 135. This may include the A/D samples generated by A/D 150. These samples along with their timestamps may be transmitted through the protocol engine 185.

The RTC 145 time may alternatively be set by GPS receiver circuitry 144. The GPS receiver circuitry 144 may be coupled with a GPS antenna 166 which may be located internally or externally to the IED 10. The GPS receiver 144 may be coupled with the RTC 145 as shown or coupled with the bus 142 such that position, and time information is made available to the CPU 130 or the DSP 135.

Setpoints

The CPU 130 and/or the DSP 135 may have the ability to execute instructions to trigger outputs from the ASIC 100 and the IED 10. The outputs may be indicative of parameters within the IED 10, such as when a power parameter falls outside a preset range. The preset range of a parameter may be defined with one or more determined setpoints identified for the particular parameter. The capability to trigger outputs based on determined parameters is also the fundamental function of a protective relay. Protective relays may have a time element associated with a setpoint such that the corresponding parameter must fall outside of a given range for a given amount of time in order to trigger an output. For instance an $I^2T$ value must exceed a threshold.

The ASIC 100 within the IED 10 may support both instantaneous and time delayed setpoint operation. As an example, if a current on phase A of the power system 129 exceeds a preset $I^2T$ threshold calculated by the CPU 130, the CPU 130 may trigger an output via I/O circuitry 175. The output may, for example, trip a breaker 122 via I/O interface circuitry 112. I/O interface circuitry 112 may provide isolation, a power source, transformation, filtering, etc. for both inputs from and outputs to external devices. Tripping the breaker 122 in this example may remove the load from the power system 129 that caused the overcurrent condition. In other examples, any other type of power system device(s) such as relays, contactors, electronic trip units, etc. can also be controlled by the ASIC 100.

Breaker Closure Synchronization

The ASIC 100 may also perform a synchronizing function within the power system 129. For example, as illustrated in FIG. 1, the ASIC 100 may receive via the interface circuitry 105 a voltage input VS from the power system 129. The voltage input VS may be provided from the side of the breaker 122 that is opposite to the side of the breaker 122 where voltage inputs V1 through V4 are provided. If there are power sources on both sides of the breaker 122 and the breaker 122 is open, the DSP 135 and/or the CPU 130 can compare the phase of the VS voltage versus the V3 voltage. When both voltages are in phase within a given tolerance, the DSP 135 and/or the CPU 130 can trigger the breaker 122 to close via I/O interface circuitry 112 and I/O circuitry 175. This functionality allows the IED 10 to be used in applications such as generator protection, cogeneration installations, etc.

I/O

The IED 10 may be provided status inputs 172 which interface through I/O interface circuitry 112 to I/O circuitry 175 in the ASIC 100. The I/O circuitry 175 may include capability to accommodate both inputs and outputs for both analog and digital signals. The DSP 135 and/or the CPU 130 can execute instructions to read the status inputs, record their value in logs in the memory 140 and trigger additional power management functionality in response to the recorded values. The status inputs 172 may be digital and/or analog inputs. The IED 10 may also provide digital and analog output signals through I/O interface circuitry 112 via the I/O circuitry 175. For example, as illustrated in FIG. 1, a digital output signal from the IED 10 may drive a pulse LED 178. The DSP 135 and/or CPU 130 may drive devices such as the pulse LED 178 on and off through I/O interface circuitry 112 and I/O circuitry 175 at a given rate based on power parameters such as kWh. Alternatively, or in addition, devices such as the pulse LED 178 may be driven directly by the I/O circuitry 175. The status inputs may be used to interface to transducers that produce pulses or analog signals indicative of the flow of water, gas, steam or air. Thus, the CPU 130 or DSP 135 may make consumption calculations based on these signals including counting the pulses and determining a unit of consumption based on pulses or analog signals.

Data Mirroring

Figure 3:
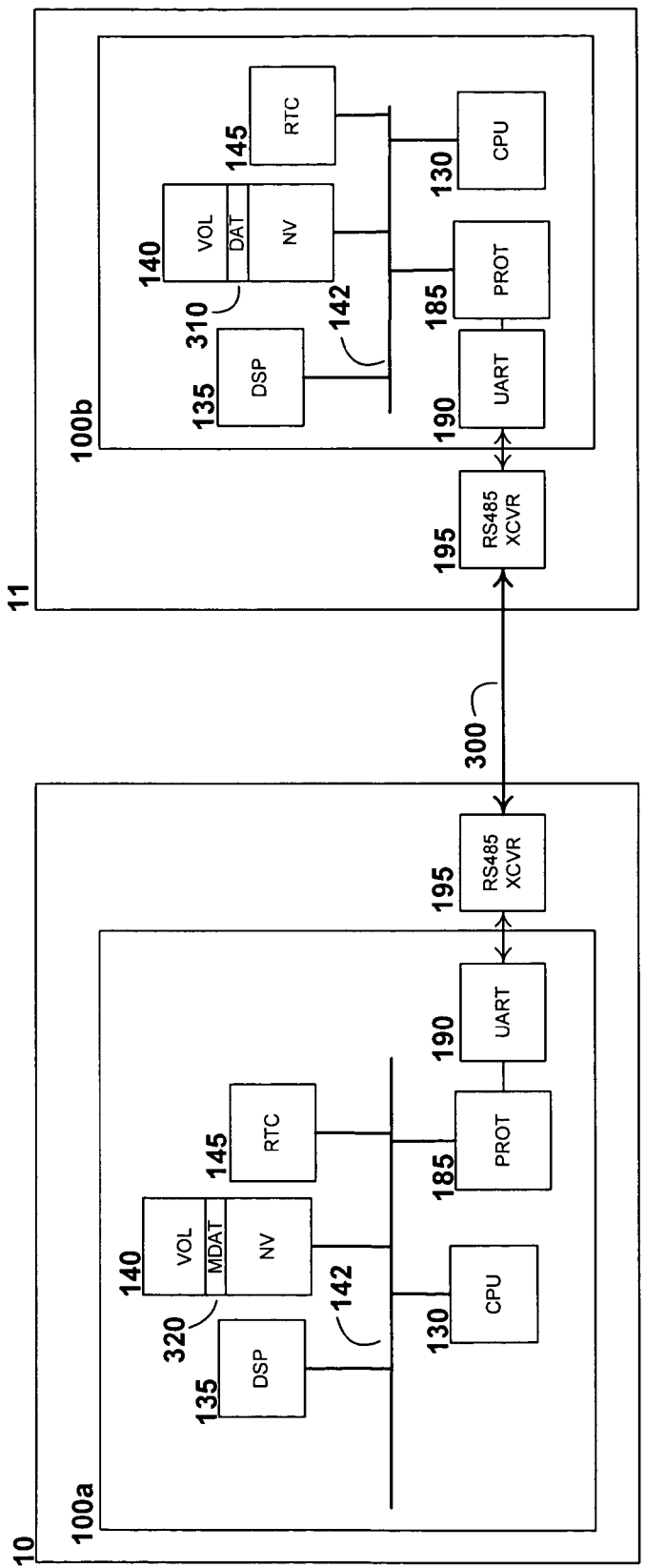
FIG. 3 depicts a block diagram of two IEDs in communication with each other.

Referring now to FIG. 3, an example first IED 10 and an example second IED 11 are shown in example communication. In this example, the IEDs 10 and 11 are communicating over an RS-485 bus 300 via respective RS-485 transceivers 195. In other examples, the IEDs 10 and 11 may communicate over Ethernet or any other applicable communications pathway. For purposes of clarity, some of the previously discussed elements of the IED 10 have been omitted in FIG. 3.

In the illustrated example, ASIC 100a in the first IED 10 may act as the master and retrieve data 310 from the memory 140 of ASIC 100b in the second IED 11. Communication of the data may be through the protocol engines 185, the UARTs 190, the RS-485 transceivers 195 and the RS-485 bus 300. The data 310 may be stored in the memory 140 of ASIC 100a in the first IED 10 as mirrored data 320.

The mirror data 320 version of the data 310 may be continually updated such that setpoint and protective relay functions can be remotely executed by the ASIC 100a in the first IED 10 based on the mirrored data 320 as if the first IED 10 were directly monitoring the power parameter(s) the data 310 represents. The data 310 may include any power parameter monitored or calculated by the ASIC 100b in the second IED 11 such as voltage, current, kW, kVA, kVAR, frequency, power factor, THD, harmonics, symmetrical components, power quality parameters, etc. Alternatively, the update frequency for the mirror data 320 may be selected when the ASIC 100a in the first IED 10 is performing monitoring or control functions that operate with less frequent updates.

The ASICs 100a and 100b in the first and second IEDs 10 and 11 may also selectively provide remote setpoint and protective relay functions for each other. Select provision of the setpoint and protective relay functions may be based on determined commands communicated between the ASICS 100a and 10b in the first and second IEDs 10 and 11. For example, upon sensing an internal failure, ASIC 100b in the second IED 11 may transmit a command to ASIC 100a in the first IED 10 to take over and remotely control setpoint and protective relay functions. In addition, if ASIC 100a in the IED 10 detects that a breaker has not been successfully tripped by ASIC 100b in the IED 11 based on the mirrored data 320, it may attempt to trip a breaker itself. This provides a backup protection functionality as ASIC 100a in the IED 10 may wait an additional time before attempting the trip to give ASIC 100b in the IED 11 time to trip. If the breaker connected to IED 10 is further upstream in the power system allowing IED 11 to trip first allows for less disruption to the loads in the power system.

Digital Sensor

Figure 4:
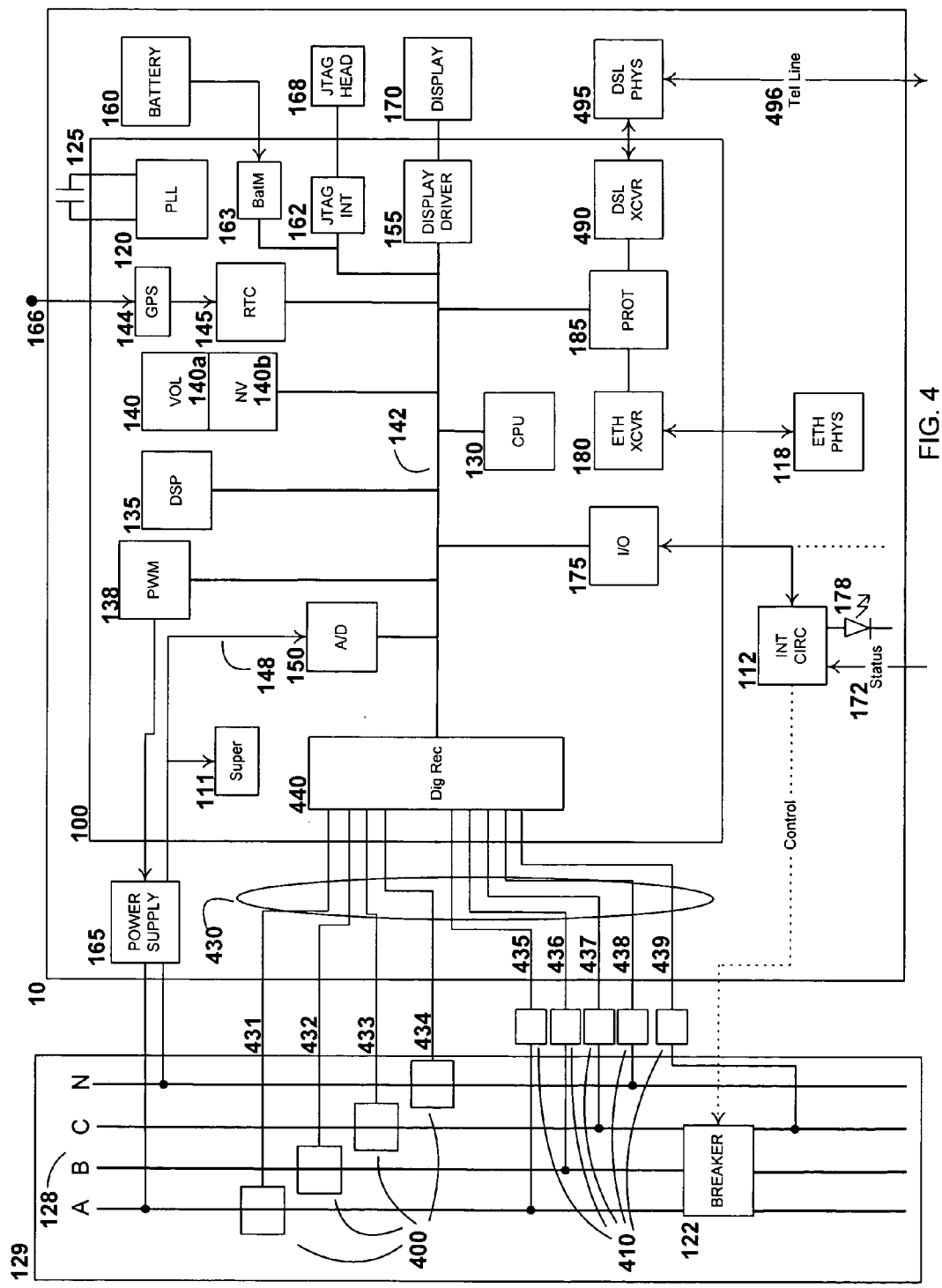
FIG. 4 depicts a block diagram of another IED incorporating an ASIC and digital sensors.

Referring now to FIG. 4, the IED 10 may also incorporate digital sensors. As illustrated in the example of FIG. 4, a plurality of current digital sensors 400 and voltage digital sensors 410 may be coupled with the power lines 128. The digital sensors 400 and 410 produce sample data in the form of digital signals that are indicative of current and voltage, respectively. The digital signals representative of sample data may be transmitted over communication lines 430. The communications lines 430 may terminate on the IED 10 to provide the digital signals to digital receiving circuitry 440 included in the ASIC 100. Digital sensors that monitor more than one phase and/or both voltage and current of the power system may be used, in which case less communications lines may be needed. In an alternative example a single digital sensor may monitor a current and voltage pair. The digital sensor itself may calculate power, energy and other power parameters for the attached pair to reduce the number of calculations needed to be performed in the ASIC 100. In another alternative example multiple digital sensors may communicate to each other in addition to IED 10 and ASIC 100 to synchronize the sampling of the analog signals 128. Synchronization of sampling may be important to help reduce any calculation errors that may occur when combining parameters of multiple phases.

The digital receiving circuitry 440 may store the digital samples and make them available to the CPU 130 and/or the DSP 135 over the bus 142. Alternatively, where the communication lines 430 are Ethernet communication lines, the digital receiving circuitry 440 can be omitted and the digital sensors 400 and 410 may be coupled with the Ethernet physical layer transceiver 118. The digital sensors 400 and 410 may, for example, comply with the ITMEL Instrument Transducer-Meter Communication Ethernet Link as defined in the standard of the same name which is hereby incorporated by reference. In the example illustrated in FIG. 4, the ASIC 100 is all digital instead of the example ASIC 100 of FIG. 1 that included mixed signal inputs. Accordingly, in the example ASIC 100 of FIG. 4 may be replaced by a Field Programmable Gate Array ("FPGA") or other types of programmable logic. Gate Arrays and especially FPGAs reduce the upfront non-recurring engineering ("NRE") costs associated with the production of a completely custom ASIC. Therefore, for lower volume products they may be viable alternates. Alternatively the ASIC 100 can be partially an FPGA and partially a hardcoded section. This allows the ASIC 100 configurability but with lower NRE costs. In one example the core power metering calculations is an ASIC circuit but the protocol engine and additional logic is contained within the FPGA section of ASIC 100.

In the example illustrated in FIG. 4, the RS-485 circuitry within the ASIC 100 has been replaced with a digital subscriber line (DSL) transceiver 490. The DSL transceiver 490 may interface with DSL physical layer circuitry 495 within the IED 10. The DSL physical layer circuitry 495 may provide an external interface via a telephone line 496. It will be appreciated that there are many varieties of DSL technology available such as, Asynchronous Digital Subscriber Line ("ADSL"), etc., each of which may be applicable for use with the IED 10 depending on the application. In addition DSL transceiver 490 may be replaced by a cable modem transceiver and DSL physical layer circuit 495 may be replaced by cable modem physical layer circuitry such that the ASIC 100 may communicate over the cable television infrastructure.

It is therefore intended that the foregoing detailed description and drawings be regarded as illustrative rather than limiting, and further includes all equivalents, that are intended to define the spirit and scope of this invention. Accordingly, the invention is not to be restricted except in light of the attached claims and their equivalents.

We claim:

1. A power management integrated circuit for use in an intelligent electronic device for monitoring at least one parameter of an AC power system, the power management integrated circuit comprising:

sensor interface circuitry formed as part of said power management integrated circuit, said sensor interface circuitry operative to receive and process signals representative of voltage and current in an AC power system;

first logic formed as part of said power management integrated circuit and coupled with said sensor interface circuitry, said first logic operative to receive said signals and produce at least one power parameter, said first logic comprising at least one processor core;

at least one random access memory formed as part of said power management integrated circuit and coupled with said first logic, wherein said at least one random access memory is operative to store said at least one power parameter;

second logic formed as part of said power management integrated circuit and coupled with said first logic, said second logic operative to process at least one incoming communication packet and generate at least one outgoing communication packet encapsulating said at least one power parameter; and a communications interface formed as part of said power management integrated circuit, said communications interface operative to receive said at least one incoming communication packet from outside said power management integrated circuit and transmit said at least one outgoing communication packet out of said power management integrated circuit;

wherein at least one of said at least one incoming communication packet or said at least one outgoing communication packet comprises an indicator of at least one of a source or a destination of said at least one incoming communication packet or said at least one outgoing communication packet, respectively, and wherein said communications interface comprises at least one of a universal asynchronous receiver/transmitter (UART), an Ethernet transceiver, a wireless interface or a powerline carrier transmitter/receiver, or combinations thereof.

2. The power management integrated circuit of claim 1 further comprising a realtime clock formed as part of said power management integrated circuit and coupled with said first logic, said realtime clock operative to maintain a time reference for said power management integrated circuit.

3. The power management integrated circuit of claim 2 wherein said realtime clock is set to a desired time in response to an incoming communication packet.

4. The power management integrated circuit of claim 2 wherein at least one of said first logic or said second logic, or combinations thereof, is operative to time stamp said at least one power parameter with a value provided by said realtime clock.

5. The power management integrated circuit of claim 2 further comprising global positioning system receiver circuitry formed as part of said power management integrated circuit, said global positioning system receiver circuitry operative to provide at least one of position and time information to at least one of said realtime clock and said first logic.

6. The power management integrated circuit of claim 5 further comprising a global positioning system antenna coupled with said global positioning system receiver circuitry.

7. The power management integrated circuit of claim 1 wherein said at least one random access memory comprises:
- a volatile section operative to provide temporary storage during operation of at least one of said first and second logic; and
- a non-volatile section operative to contain configuration information for said power management integrated circuit.

8. The power management integrated circuit of claim 7 wherein said at least one power parameter is stored in said non-volatile section.

9. The power management integrated circuit of claim 1 wherein said sensor interface circuitry comprises an analog front end formed as part of said power management integrated circuit, said analog front end operative to receive and at least one of amplify, attenuate or filter analog signals representative of voltage and current in said AC power system to produce modified analog signals.

10. The power management integrated circuit of claim 9 wherein said sensor interface circuitry further comprises an analog to digital converter formed as part of said power management integrated circuit and coupled with said analog front end, wherein said analog to digital converter is operative to produce digital signals representative of said modified analog signals.

11. The power management integrated circuit of claim 9 further comprising circuitry formed as part of said power management integrated circuit that is operative to convert at least one of said analog signals to a digital signal indicative of the fundamental frequency of said at least one of said analog signals.

12. The power management integrated circuit of claim 10 wherein said first logic is operative to compensate for distortion in at least one of said analog front end, said analog to digital converter or an external transformer capable of being coupled with said power management integrated circuit.

13. The power management integrated circuit of claim 10 wherein said analog to digital converter comprises a first analog to digital converter and a second analog to digital converter that are operative to substantially simultaneously sample at least two of said modified analog signals to produce said digital signals representative of said modified analog signals.

14. The power management integrated circuit of claim 1 wherein at least a portion of the power management integrated circuit is programmed into a field programmable gate array that is formed as part of said power management integrated circuit.

15. The power management integrated circuit of claim 1 wherein said sensor interface circuitry comprises a digital interface formed as part of said power management integrated circuit, said digital interface operative to receive digital signals from a digital sensor, wherein said digital signals are representative of at least one of voltage and current in an AC power system.

16. The power management integrated circuit of claim 1 wherein at least one of said at least one incoming communication packet or said at least one outgoing communication packet further comprises at least one of an error detection code or an error correction code, or combinations thereof.

17. The power management integrated circuit of claim 1 wherein said at least one outgoing communication packet comprises an outgoing fieldbus packet and said at least one incoming communication packet comprises an incoming fieldbus packet.

18. The power management integrated circuit of claim 17 wherein said incoming fieldbus packet and said outgoing fieldbus packet comprise at least one of a Modbus® protocol, a Profibus protocol or a DNP protocol.

19. The power management integrated circuit of claim 1 wherein said at least one outgoing communication packet comprises an outgoing TCP/IP packet and said at least one incoming communication packet comprises an incoming TCP/IP packet.

20. The power management integrated circuit of claim 19 wherein at least one of said incoming TCP/IP packet and said outgoing TCP/IP packet comprises at least one of an SMTP packet, an HTTP packet, a SOAP packet, a POP packet, an SNMP packet or a PPP packet, or combinations thereof.

21. The power management integrated circuit of claim 1 further comprising a phase lock loop clock circuit formed as part of said power management integrated circuit and coupled with said first logic, said phase lock loop circuit operative to provide a variable clock signal to said at least one processor core.

22. The power management integrated circuit of claim 1 wherein said at least one power parameter comprises at least one of rms voltage, rms current, power, energy, harmonic distortion, frequency or power factor, or combinations thereof.

23. The power management integrated circuit of claim 1 wherein said at least one power parameter comprises a sample of at least one of a voltage waveform, a current waveform or a power waveform, or combinations thereof.

24. The power management integrated circuit of claim 1 further comprising a control circuit formed as part of said power management integrated circuit and coupled with said first logic, said control circuit operative to control a power supply that is operable to supply operating power to said power management integrated circuit.

25. The power management integrated circuit of claim 24 wherein said control circuit is operative to control said power supply with a pulse width modulated signal.

26. The power management integrated circuit of claim 1 wherein said first logic is operative to implement at least one setpoint indicative of when said at least one power parameter is outside a determined range.

27. The power management integrated circuit of claim 26 wherein said first logic is further operative to control at least one digital output formed as part of said power management integrated circuit in response to said setpoint indication, said digital output operative to control a device external to said power management integrated circuit.

28. The power management integrated circuit of claim 27 wherein said digital output is useable to control the application of power from a power system.

29. The power management integrated circuit of claim 27 wherein said device external to said power management integrated circuit comprises a circuit breaker.

30. The power management integrated circuit of claim 1 wherein said at least one random access memory comprises magnetic random access memory.

31. The power management integrated circuit of claim 1 further comprising a supervisor circuit formed as part of said power management integrated circuit, said supervisor circuit operative to monitor a voltage level from a supply of power to said power management integrated circuit.

32. The power management integrated circuit of claim 1 wherein said first logic is operative to compensate for distortion in an external transformer capable of being coupled with said power management integrated circuit.

33. The power management integrated circuit of claim 1 further comprising a display driver formed as part of said power management integrated circuit and coupled with said first logic, said display driver operative to drive a display external to said power management integrated circuit.

34. The power management integrated circuit of claim 1 wherein said second logic is operative to secure data sent through said communications interface.

35. The power management integrated circuit of claim 1 further comprising at least one status input coupled with said first logic, wherein said first logic is operative to perform at least one consumption calculation based on said at least one status input.

36. The power management integrated circuit of claim 1 wherein the power management integrated circuit is operatively incorporated into an intelligent electronic device.

37. The power management integrated circuit of claim 1 wherein the power management integrated circuit is operatively incorporated into a protective relay.

38. The power management integrated circuit of claim 1 wherein the power management integrated circuit is operatively incorporated into a power meter.

39. The power management integrated circuit of claim 1 wherein said processor core comprises a digital signal processor.

40. The power management integrated circuit of claim 1 wherein said first logic comprises a digital signal processor and said second logic comprises a central processing unit.

41. The power management integrated circuit of claim 1 further comprising compensation circuitry formed as part of said power management integrated circuit, said compensation circuitry operative to drive an active current transformer.

42. A power management integrated circuit for use in an intelligent electronic device for monitoring at least one parameter of an AC power system, the power management integrated circuit comprising:
   sensor interface circuitry formed as part of said power management integrated circuit, said sensor interface circuitry operative to receive and process signals representative of voltage and current in an AC power system;
   a processor formed as part of said power management integrated circuit and coupled with said sensor interface circuitry, said processor operative to receive said signals and produce at least one power parameter;
   a communications interface formed as part of said power management integrated circuit, said communications interface operative to receive an incoming communication packet from outside said power management integrated circuit and transmit an outgoing communication packet out of said power management integrated circuit;
   a geographic positioning system receiver circuit formed as part of said power management integrated circuit and coupled with said processor; and
   a realtime clock formed as part of said power management integrated circuit and coupled with said processor, wherein said realtime clock is set to a desired time in response to a time value provided with one of said incoming communication packet, or said geographic position system receiver circuit.

43. The power management integrated circuit of claim 42 wherein at least one of said incoming communication packet and said outgoing communication packet comprises an indicator of at least one of a source or a destination of said incoming communication packet or said outgoing communication packet, respectively.

44. The power management integrated circuit of claim 42 wherein said communications interface comprises a universal asynchronous receiver/transmitter (UART).

45. The power management integrated circuit of claim 42 further comprising a random access memory formed as part of said power management integrated circuit coupled with said processor, wherein said random access memory is operative to store said at least one power parameter.

46. The power management integrated circuit of claim 42 wherein said communications interface comprises a wireless interface.

47. The power management integrated circuit of claim 42 wherein said communications interface comprises an Ethernet transceiver.

48. The power management integrated circuit of claim 42 wherein said communications interface comprises a powerline carrier interface.

49. A power management integrated circuit for use in an intelligent electronic device for monitoring at least one parameter of an AC power system, the power management integrated circuit comprising:
   a processor formed as part of said power management integrated circuit, wherein said processor is operative to receive signals indicative of voltage and current in an AC power system, and produce a power parameter therefrom;
   a random access memory comprising a volatile portion and a non-volatile portion, said random access memory formed as part of said power management integrated circuit and coupled with said processor, wherein said random access memory is operative to store said power parameter in said non-volatile portion;
   a field programmable gate array formed as part of said power management integrated circuit, wherein said field programmable gate array is operative as a protocol engine;
   a communications interface formed as part of said power management integrated circuit, said communications interface cooperatively operative with said field programmable gate array to receive and process an incoming communication packet from outside said power management integrated circuit, and process and transmit an outgoing communication packet out of said power management integrated circuit; and
   wherein said communications interface comprises at least one of a universal asynchronous receiver/transmitter (UART), an Ethernet transceiver, a wireless interface, or a powerline carrier transmitter/receiver, or combinations thereof.

50. The power management integrated circuit of claim 49 further comprising a geographic positioning system receiver circuit formed as part of said power management integrated circuit and coupled with said processor, wherein said geographic positioning system receiver circuit is operative to provide position and time information to said processor.

51. The power management integrated circuit of claim 50 further comprising a realtime clock formed as part of said power management integrated circuit and coupled with said processor, wherein said realtime clock is set to a desired time in response to one of said incoming communication packet or said time information providable by said geographic positioning system receiver circuit.

* * * * *